(12) United States Patent
Liu et al.

(10) Patent No.: US 11,948,393 B2
(45) Date of Patent: Apr. 2, 2024

(54) DISPLAY SUBSTRATE AND DISPLAY APPARATUS

(71) Applicant: BOE Technology Group Co., Ltd., Beijing (CN)

(72) Inventors: Hao Liu, Beijing (CN); Mei Li, Beijing (CN); Jiuzhen Wang, Beijing (CN); Zunqing Song, Beijing (CN); Qiuhua Meng, Beijing (CN); Caiyu Qu, Beijing (CN); Ming Liu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/908,429

(22) PCT Filed: Nov. 15, 2021

(86) PCT No.: PCT/CN2021/130561
§ 371 (c)(1),
(2) Date: Aug. 31, 2022

(87) PCT Pub. No.: WO2022/156325
PCT Pub. Date: Jul. 28, 2022

(65) Prior Publication Data
US 2023/0351796 A1 Nov. 2, 2023

(30) Foreign Application Priority Data

Jan. 19, 2021 (CN) .......................... 202110068464.6

(51) Int. Cl.
*G06V 40/13* (2022.01)
*H10K 59/65* (2023.01)

(52) U.S. Cl.
CPC .......... *G06V 40/1306* (2022.01); *H10K 59/65* (2023.02)

(58) Field of Classification Search
CPC ..... G06V 40/1306; G06V 40/12–1394; H10K 59/65
See application file for complete search history.

(56) References Cited

U.S. PATENT DOCUMENTS

2018/0130857 A1* 5/2018 Lee ...................... H10K 59/131
2021/0272520 A1 9/2021 Yang et al.

FOREIGN PATENT DOCUMENTS

| CN | 110223634 A | 9/2019 |
| CN | 112183398 A | 1/2021 |
| CN | 112883793 A | 6/2021 |

OTHER PUBLICATIONS

PCT/CN2021/130561 international search report and written opinion.

* cited by examiner

*Primary Examiner* — Premal R Patel
(74) *Attorney, Agent, or Firm* — IPro, PLLC

(57) ABSTRACT

A display substrate and a display apparatus are provided. The display substrate includes: a base substrate; a plurality of sub-pixels arranged on the base substrate, wherein the sub-pixels each include a sub-pixel driving circuit; a plurality of fingerprint recognition structures arranged on the base substrate, wherein the fingerprint recognition structures each include a control circuit and a fingerprint recognition electrode, the fingerprint recognition electrode is located on a side of the control circuit facing away from the base substrate, the control circuit is coupled to the fingerprint recognition electrode, and the control circuit is used for outputting a sensing signal from the fingerprint recognition electrode; wherein the control circuit and the sub-pixel driving circuit are arranged in a direction parallel to the base substrate.

14 Claims, 4 Drawing Sheets

DISPLAY SUBSTRATE AND DISPLAY APPARATUS

CROSS-REFERENCE TO RELATED APPLICATIONS

This application is the U.S. national phase of PCT Application No. PCT/CN2021/130561 filed on Nov. 15, 2021, which claims priority to the Chinese patent application No. 202110068464.6 filed in China on Jan. 19, 2021, the disclosures of which are hereby incorporated by reference in their entireties.

TECHNICAL FIELD

The present disclosure relates to the field of display technology, and more particularly, to a display substrate and a display apparatus.

BACKGROUND

In the full-screen product era in which the maximum screen-to-body ratio is pursued, enabling fingerprint recognition function at any position on the full-screen display is more desirable. In conventional full-screen fingerprint recognition processes, the main way to realize the integration of fingerprint recognition function is to attach an independent fingerprint recognition sensor to a non-display-specific region on the back or front face of the screen module, so as to realize the fingerprint recognition function.

Common fingerprint recognition integration methods include: the ultrasonic plug-in mode integration and the In Cell optical mode integration. The ultrasonic plug-in mode integration will increase the module thickness and the manufacturing cost; while the in Cell optical mode integration requires complex optical path design such as collimating structure, to reduce the influence of stray light on fingerprint recognition.

Therefore, there is a need for a new integration method that avoids increasing the thickness of the display apparatus, reduces the manufacturing cost of the display apparatus, and avoids complicated light collimating structure designs, while achieving the integration of fingerprint recognition function in the display apparatus.

SUMMARY

A first aspect of the present disclosure provides a display substrate including:
a base substrate;
a plurality of sub-pixels arranged on the base substrate, the sub-pixels each including a sub-pixel driving circuit;
a plurality of fingerprint recognition structures arranged on the base substrate, the fingerprint recognition structures each including a control circuit and a fingerprint recognition electrode, the fingerprint recognition electrode being located on a side of the control circuit facing away from the base substrate, the control circuit being coupled to the fingerprint recognition electrode, the control circuit being used for outputting a sensing signal from the fingerprint recognition electrode; the control circuit and the sub-pixel driving circuit being arranged in a direction parallel to the base substrate.

Optionally, the sub-pixels each include a pixel opening region; an orthographic projection of the fingerprint recognition electrode onto the base substrate at least partially overlaps an orthographic projection of at least one pixel opening region onto the base substrate.

Optionally, the fingerprint recognition electrode includes a transparent electric-conductive oxide film layer.

Optionally, the fingerprint recognition electrode includes an electric-conductive film layer having an antireflection function, and a thickness d of the fingerprint recognition electrode in a direction perpendicular to the base substrate satisfies:

$$2*d*\sin\theta=(2k+1)*\lambda/2;$$

$\lambda$ is the wavelength of visible light, k is an integer greater than or equal to zero, and $\theta$ is an angle of incidence of ambient light into the fingerprint recognition electrode.

Optionally, the sub-pixels each further include an anode pattern, wherein the anode pattern is located on a side of the sub-pixel driving circuit facing away from the base substrate, and the anode pattern is coupled to the sub-pixel driving circuit;
the display substrate further includes:
a cathode layer, at least a portion of which is located between the anode pattern and the fingerprint recognition electrode; and
a shielding pattern, at least a portion of which is located between adjacent fingerprint recognition electrodes in the plurality of fingerprint recognition structures.

Optionally, the shielding pattern includes a mesh-like structure, and a mesh formed by the shielding pattern surrounds at least one fingerprint recognition electrode.

Optionally, the shielding pattern is coupled to the cathode layer.

Optionally, the display substrate further includes:
a first compensation pattern, wherein the first compensation pattern includes a mesh-like structure, the first compensation pattern is arranged in a same layer as the anode pattern and is made of a same material as the anode pattern, and the first compensation pattern is coupled to the cathode layer.

Optionally, the display substrate further includes:
a second compensation pattern, the second compensation pattern includes a mesh-like structure, the second compensation pattern is arranged in a same layer as the anode pattern and is made of a same material as the anode pattern, and the second compensation pattern is directly coupled to the shielding pattern.

Optionally, the fingerprint recognition structures each further include:
a first electric-conductive connection portion between the control circuit and the fingerprint recognition electrode, the first electric-conductive connection portion being coupled to the control circuit and the fingerprint recognition electrode individually.

Optionally, the fingerprint recognition structure further includes:
a second electric-conductive connection portion between the first electric-conductive connection portion and the fingerprint recognition electrode, the second electric-conductive connection portion being coupled to the first electric-conductive connection portion and the fingerprint recognition electrode individually.

Optionally, the first electric-conductive connection portion is arranged in a same layer as the anode pattern and is made of a same material as the anode pattern; and/or the second electric-conductive connection portion is arranged in a same layer as the cathode layer and is made of a same material as the cathode layer.

Optionally, a plurality of control circuits included in the plurality of fingerprint recognition structures are arranged in array, the plurality of control circuits are divided into a plurality of rows of control circuits, and each row of control circuits includes multiple control circuits arranged along a first direction; the plurality of control circuits are divided into a plurality of columns of control circuits, and each column of control circuits includes multiple control circuits arranged along a second direction;

the display substrate further includes a plurality of recognition scanning lines and a plurality of signal transmission lines; and at least part of each of the recognition scanning lines extends along the first direction, the recognition scanning lines are coupled to the control circuits in a corresponding row of control circuits, respectively, at least part of each of the signal transmission lines extends along the second direction, and the signal transmission lines are coupled to the control circuits in a corresponding column of control circuits, respectively; and the control circuit is used for outputting a sensing signal from the fingerprint recognition electrode to a corresponding signal transmission line under the control of a corresponding recognition scanning line.

Optionally, the control circuit includes a control transistor, a gate electrode of the control transistor is coupled to a corresponding recognition scanning line, an input electrode of the control transistor is coupled to the fingerprint recognition electrode, and an output electrode of the control transistor is coupled to a corresponding signal transmission line;

the sub-pixel driving circuit includes a first transistor, and an output electrode of the first transistor is coupled to the anode pattern; the gate electrode of the control transistor is arranged in a same layer as the gate electrode of the first transistor and is made of a same material as the gate electrode of the first transistor; an active pattern of the control transistor is arranged in a same layer as an active pattern of the first transistor and is made of a same material as the active pattern of the first transistor; and both the input electrode of the control transistor and the output electrode of the control transistor are arranged in a same layer as the output electrode of the first transistor and are made of a same material as the output electrode of the first transistor.

Based on the above-mentioned technical solution of the display substrate, a second aspect of the present disclosure provides a display apparatus including the above-mentioned display substrate.

BRIEF DESCRIPTION OF THE DRAWINGS

The accompanying drawings are included to provide a further understanding of the disclosure and constitute a part of this disclosure, exemplary embodiment(s) of the disclosure and description thereof serve to explain the disclosure and do not constitute an undue limitation on the disclosure. In the drawings.

DETAILED DESCRIPTION

In order to further explain the display substrate and the display apparatus provided by the embodiments of the present disclosure, a detailed description is made in conjunction with the accompanying drawings.

Figure 1:
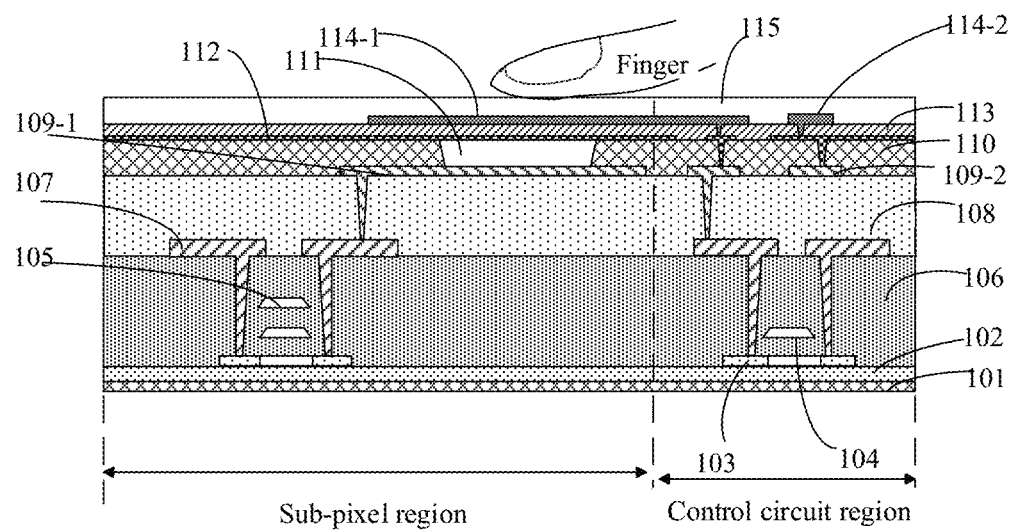
FIG. 1 is a first schematic cross-sectional view of a display substrate provided in an embodiment of the present disclosure.

With reference to FIG. 1, an embodiment of the present disclosure provides a display substrate, including: a base substrate 101; a plurality of sub-pixels arranged on the base substrate 101, the sub-pixels each including a sub-pixel driving circuit; a plurality of fingerprint recognition structures arranged on the base substrate 101, wherein the fingerprint recognition structures each include a control circuit (such as a control transistor located in a control circuit region) and a fingerprint recognition electrode 114-1, the fingerprint recognition electrode 114-1 is located on a side of the control circuit facing away from the base substrate 101, the control circuit is coupled to the fingerprint recognition electrode 114-1, and the control circuit is used for outputting a sensing signal from the fingerprint recognition electrode 114-1; the control circuit and the sub-pixel driving circuit are arranged in a direction parallel to the base substrate 101.

It should be noted that FIG. 1 also shows: a buffer layer 102, an active layer 103, a first gate metal layer 104, a second gate metal layer 105, an interlayer dielectric layer 106 (including a first gate insulation layer, a second gate insulation layer and an interlayer insulation layer), and a first source and drain metal layer 107.

Illustratively, the sub-pixels each include: a sub-pixel driving circuit and a light-emitting device arranged on a side of the sub-pixel driving circuit facing away from the base substrate 101; the sub-pixel driving circuit includes a 7T1C structure or a 2T1C structure, etc.; the light-emitting device includes an anode pattern 109-1, a light-emitting function layer (not shown), and a cathode layer 112, which are sequentially stacked in a direction away from the base substrate 101.

Illustratively, the plurality of subpixels includes a plurality of red subpixels (R), a plurality of green subpixels (G), and a plurality of blue subpixels (B), the plurality of subpixels forming a plurality of pixel units, each pixel unit including one R, one B, and two G.

Figure 5:
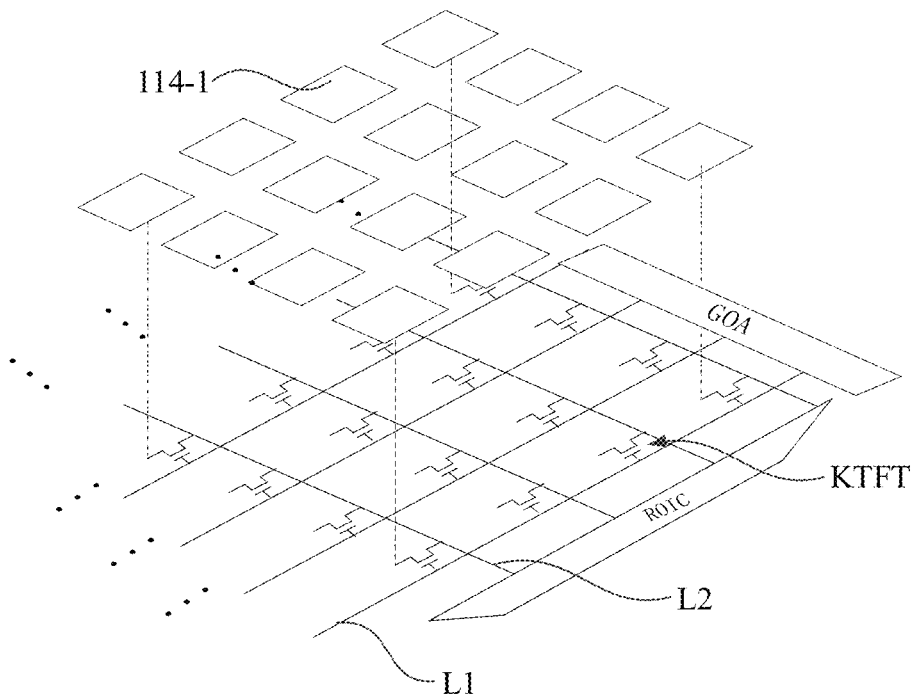
FIG. 5 is a schematic diagram of a fingerprint recognition structure provided in an embodiment of the present disclosure.

As shown in FIG. 5, illustratively, the display substrate further includes a readout chip (ROIC). The control circuit (including a control transistor KTFT) is capable of outputting the sensing signal from the fingerprint recognition electrode 114-1, to which the control circuit is coupled, to the ROIC.

In more detail, an encapsulation layer 115 is provided between the fingerprint recognition electrode 114-1 and a finger, and the encapsulation layer 115 can serve as an intermediary dielectric layer, so that a capacitance is formed between the fingerprint recognition electrode 114-1 and the finger; based on a difference between the capacitance formed between the "valley" of fingerprint and the fingerprint recognition electrode 114-1 and the capacitance formed between the "ridge" of fingerprint and the fingerprint recognition electrode 114-1, the control circuit correspondingly outputs different voltage signals to the readout chip; and the readout chip performs detection by means of charge integration amplification, and finally completes the fingerprint recognition function.

Illustratively, the plurality of sub-pixels include a plurality of sub-pixel driving circuits, the plurality of fingerprint recognition structures include a plurality of control circuits, and the plurality of sub-pixel driving circuits and the plurality of control circuits may be arranged in a direction parallel to the base substrate 101. Illustratively, the sub-pixels and the control circuits are designed to have a one-to-one relationship. Taking FHD 400 pixels per inch (PPI) as an example, the fingerprint recognition sensing is also 400 PPI. Illustratively, the plurality of sub-pixel driving circuits and the plurality of control circuits are alternately distributed. Illustratively, the sub-pixels and the control circuits are designed to have a one-to-many relationship, to implement a fingerprint recognition sensing device with higher PPI. Illustratively, the plurality of sub-pixel driving circuits are divided into a plurality of groups of sub-pixel driving circuits, each group of sub-pixel driving circuits includes at least two sub-pixel driving circuits, and the plurality of groups of sub-pixel driving circuits and the plurality of control circuits are alternately distributed.

Illustratively, the plurality of sub-pixel driving circuits and the plurality of control circuits are uniformly arranged on the base substrate 101.

Illustratively, the plurality of sub-pixel driving circuits and the plurality of control circuits are uniformly arranged in a display region of a display substrate, and the display substrate can realize fingerprint sensing in the entire display region.

Illustratively, the display substrate includes an active matrix organic light-emitting diode display substrate; the display substrate adopts a top emission structure; an array of sub-pixel driving circuits and an array of control circuits are provided on the display substrate; the array of sub-pixel driving circuits and the array of control circuits are embedded into each other; and the array of sub-pixel driving circuits and the array of control circuits enable the synchronous process production and sharing of some film layers.

It should be noted that the manufacturing process of the control circuit is compatible with the manufacturing process of the sub-pixel driving circuit, and the manufacturing of the control circuit can be completed during the manufacturing process of the sub-pixel driving circuit.

According to the above-mentioned specific structure of the display substrate, it can be seen that in the display substrate provided by the embodiments of the present disclosure, the fingerprint recognition structure is integrated inside the display substrate, and the control circuit and the sub-pixel driving circuit are arranged in a direction parallel to the base substrate 101, so that the fingerprint recognition structures and the sub-pixels can be integrated in an embedded manner, not only enabling the display substrate to achieve full-screen fingerprint recognition at any display position and the maximum screen-to-body ratio, but also not significantly increasing the thickness and weight of the display substrate, which is beneficial to the development of lightweight and thin display substrates. Furthermore, the fingerprint recognition structure achieves fingerprint recognition by means of a touch-induced capacitance change, avoiding complicated optical path designs such as a collimating structure.

As shown in FIGS. 1 to 4, FIG. 6, and FIG. 7, in some embodiments, the sub-pixels each include a pixel opening region 111; the orthographic projection of the fingerprint recognition electrode 114-1 onto the base substrate 101 at least partially overlaps the orthographic projection of at least one pixel opening region 111 onto the base substrate 101.

Figure 6:
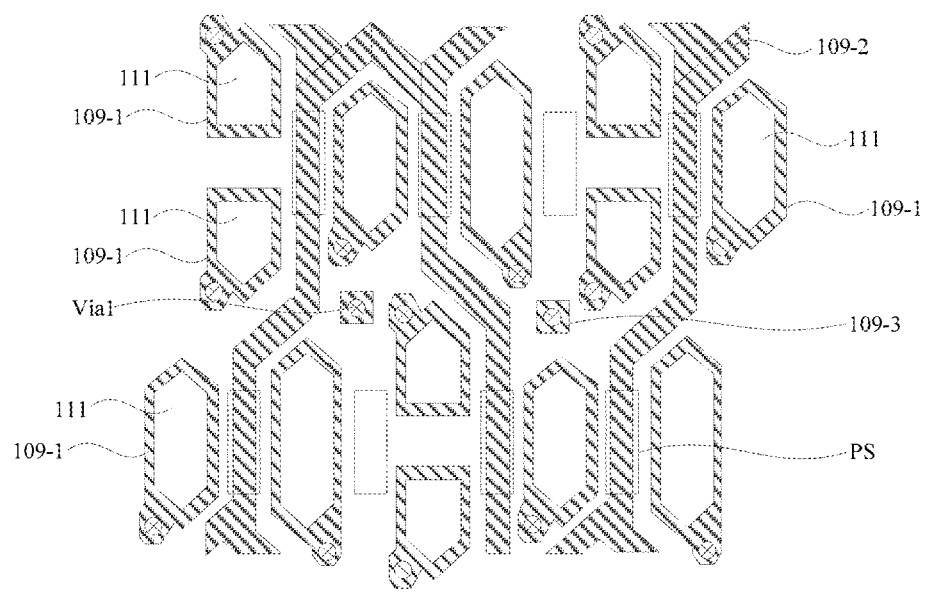
FIG. 6 is a schematic diagram of an anode layer and an opening region provided in an embodiment of the present disclosure.

It is noted that, a dotted box in FIG. 6 indicates a layout position of a spacer PS.

Illustratively, the orthographic projection, onto the base substrate, of the layout region of the control circuit to which the fingerprint recognition electrode 114-1 is connected is adjacent to the orthographic projection, onto the base substrate, of the layout region of the sub-pixel driving circuit corresponding to the at least one pixel opening region 111. It is noted that the sub-pixel driving circuit corresponding to the pixel opening region 111 refers to: a sub-pixel driving circuit included in the sub-pixel to which the pixel opening region 111 belongs.

Illustratively, the orthographic projection of the fingerprint recognition electrode 114-1 onto the base substrate 101 at least partially overlaps the orthographic projection of the plurality of pixel opening regions 111 onto the base substrate 101, and the layout region of the control circuitry to which the fingerprint recognition electrode 114-1 is connected is surrounded by the layout region of the sub-pixel driving circuitry corresponding to at least some of the plurality of pixel opening regions 111.

Illustratively, each pixel unit in a display substrate includes one R, one B and two G, the fingerprint recognition electrode 114-1 is in one-to-one correspondence with at least some of the pixel units, and the orthographic projection of the fingerprint recognition electrode 114-1 onto the base substrate 101 covers the orthographic projection, onto the base substrate 101, of the pixel opening regions 111 included by the sub-pixels in the corresponding pixel unit.

Illustratively, a plurality of sub-pixels in a display substrate are divided into a plurality of sub-pixel groups, each sub-pixel group includes at least one sub-pixel, the fingerprint recognition electrode 114-1 corresponds to at least some of the sub-pixel groups on a one-to-one basis, and the orthographic projection of the fingerprint recognition electrode 114-1 onto the base substrate 101 covers the orthographic projection, onto the base substrate 101, of the pixel opening regions 111 included by the sub-pixels in the corresponding sub-pixel group. Illustratively, the orthographic projection of the fingerprint recognition electrode 114-1 onto the base substrate 101 at least partially overlaps the orthographic projection, onto the base substrate 101, of the pixel opening regions 111 included by the sub-pixels in the corresponding sub-pixel group.

In the display substrate provided in the above-mentioned embodiment, by arranging the orthographic projection of the fingerprint recognition electrode 114-1 onto the base substrate 101 to at least partially overlap the orthographic projection of at least one pixel opening region 111 onto the base substrate 101, the layout space inside the display substrate is fully utilized, and high dots per inch (DPI) capacitive fingerprint recognition structure integration is achieved without reducing the display PPI.

As shown in FIGS. 1 to 4, in some embodiments, the fingerprint recognition electrode 114-1 includes a transparent electric-conductive oxide film layer.

Illustratively, the fingerprint recognition electrode 114-1 is made of a high transmittance transparent electric-conductive oxide material, including indium tin oxide (ITO) or aluminum-doped zinc oxide (AZO), etc.

During manufacturing the fingerprint recognition electrode 114-1, a transparent electric-conductive oxide material having a high transmittance may be patterned to form a transparent electric-conductive oxide film layer.

That the fingerprint recognition electrode 114-1 includes a transparent electric-conductive oxide film layer allow the fingerprint recognition electrode 114-1 not to affect the light output rate of the sub-pixel in the case that the fingerprint recognition electrode 114-1 overlaps the pixel opening region 111.

In some embodiments, the fingerprint recognition electrode 114-1 includes an electric-conductive film layer having an antireflection function, and a thickness d of the fingerprint recognition electrode 114-1 in a direction perpendicular to the base substrate 101 satisfies:

$2*d*\sin\theta=(2k+1)*\lambda/2$; $\lambda$ is the wavelength of visible light, k is an integer greater than or equal to zero, and $\lambda$ is the angle of incidence of ambient light into the fingerprint recognition electrode 114-1.

Illustratively, the fingerprint recognition electrode 114-1 includes a translucent electric-conductive film layer having an antireflection function.

Illustratively, the electric-conductive film layer includes: MoOx and Mo film layers arranged in a stack, or SiO, Ti, SiO film layers arranged in a stack.

Illustratively, the angle of incidence of ambient light into the fingerprint recognition electrode 114-1 ($\theta$) may be a 90-degree angle or an acute angle.

That the thickness d of the fingerprint recognition electrode 114-1 in the direction perpendicular to the base substrate 101 is set to satisfy $2*d*\sin\theta=(2k+1)*\lambda 2$ allows the optical path difference to be an odd multiple of the half wavelength of visible light, which satisfies the requirement for antireflection by means of destructive interference, so that the fingerprint recognition electrode 114-1 functions to reduce the reflection of ambient light while being used for realizing a fingerprint recognition function. Therefore, in a display substrate provided in the above embodiment, with the fingerprint recognition electrode 114-1 including an electric-conductive film layer having an antireflection function, the fingerprint recognition electrode 114-1 can substitute a polarizer to perform an ambient light antireflection function. Therefore, the display substrate provided in the above-mentioned embodiments does not need a polarizer, which is beneficial to thinning of the display substrate.

As shown in FIGS. 1 to 4 and FIG. 6, in some embodiments, the sub-pixel further includes an anode pattern 109-1, wherein the anode pattern 109-1 is located on a side of the sub-pixel driving circuit facing away from the base substrate 101, and the anode pattern 109-1 is coupled to the sub-pixel driving circuit;

the display substrate further includes:
a cathode layer 112, at least part of the cathode layer 112 being located between the anode pattern 109-1 and the fingerprint recognition electrode 114-1;
a shielding pattern 114-2, at least part of the shielding pattern 114-2 being located between adjacent fingerprint recognition electrodes 114-1 in the plurality of fingerprint recognition structures.

Illustratively, an anode layer is formed by depositing a ITO material, and the anode layer is patterned to form the anode pattern 109-1.

Illustratively, after the anode pattern 109-1 is formed, the process continues to fabricate a pixel definition layer 110, the pixel definition layer 110 defining a plurality of pixel opening regions 111. Then a light-emitting function layer is formed, wherein the light-emitting function layer includes a common film layer and an organic light-emitting material layer, and the common film layer includes an electron transmission layer, an electron injection layer, a hole transmission layer and a hole injection layer, and the common film layer and the organic light-emitting material layer are evaporation deposited by using a fine metal mask (FMM). Then the cathode layer 112 is evaporation deposited by using an FMM. Subsequently, a planar dielectric layer 113 is deposited, wherein the planar dielectric layer 113 can be an organic photosensitive film layer or an inorganic layer; when the planar dielectric layer 11 is the organic photosensitive film layer, the planar dielectric layer 11 is perforated through photo patterning; when the planar dielectric layer 11 is an inorganic insulation layer, the planar dielectric layer 11 is perforated by using a laser. Then, an electric-conductive film layer is deposited and patterned to form the fingerprint recognition electrode 114-1.

Illustratively, the shielding pattern 114-2 is disposed in the same layer as the fingerprint recognition electrode 114-1 and is made of same material as the fingerprint recognition electrode 114-1. The method of making the shielding pattern 114-2 includes: depositing to form the electric-conductive film layer, and patterning the electric-conductive film layer to form the fingerprint recognition electrode 114-1 and the shielding pattern 114-2 simultaneously.

Illustratively, the shielding pattern 114-2 has a fixed potential, the fixed potential including a GND potential.

In the display substrate provided in the above embodiment, by disposing at least part of the shielding pattern 114-2 between adjacent fingerprint recognition electrodes 114-1 in the plurality of fingerprint recognition structures, the shielding pattern 114-2 can adequately shield against mutual interference between adjacent fingerprint recognition electrodes 114-1, so that the noise interference to a sensing capacitance formed between the fingerprint recognition electrode 114-1 and a finger is effectively reduced.

In addition, by disposing at least a portion of the cathode layer 112 between the anode pattern 109-1 and the fingerprint recognition electrode 114-1 so that the fingerprint recognition electrode 114-1 can be separated by the cathode layer 112 from the sub-pixel driving circuit, the cathode layer 112 effectively shields against the interference of the sub-pixel driving circuit to the fingerprint recognition electrode 114-1, thereby further reducing noise interference to the sensing capacitance.

Figure 7:
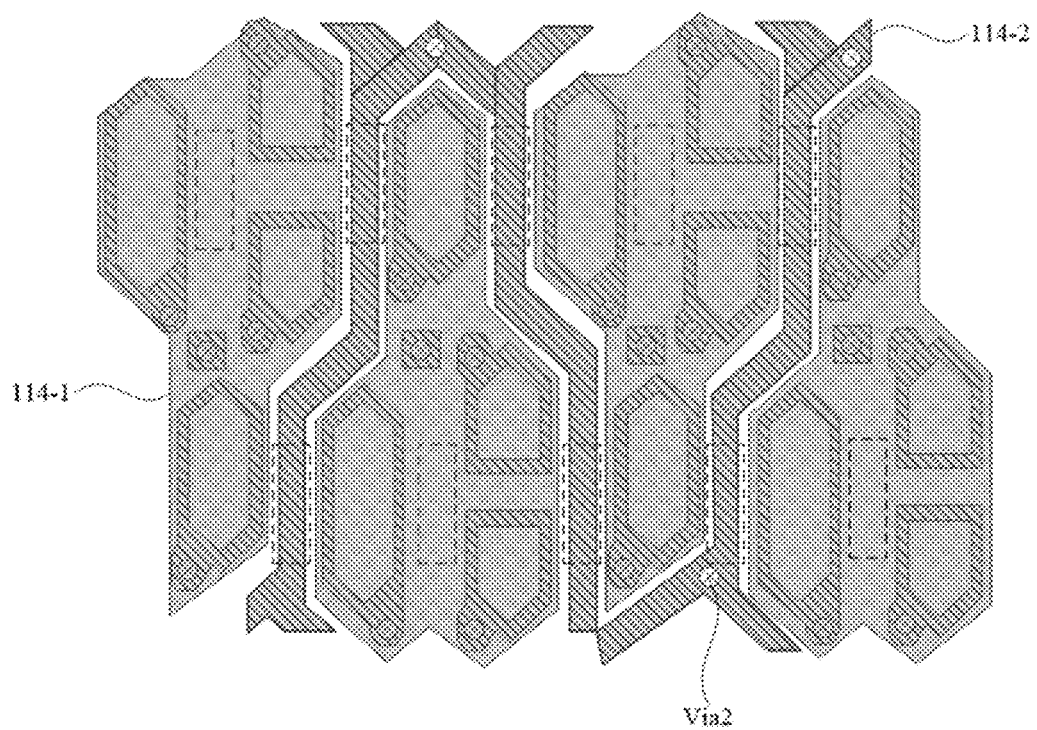
FIG. 7 is a schematic diagram of a fingerprint recognition electrode and a shielding pattern provided in an embodiment of the present disclosure.

As shown in FIG. 7, in some embodiments, the shielding pattern 114-2 includes a mesh-like structure, and a mesh formed by the shielding pattern 114-2 surrounds at least one fingerprint recognition electrode 114-1.

Illustratively, the shielding pattern 114-2 forms a plurality of meshes, each mesh surrounds at least one fingerprint recognition electrode 114-1, and each fingerprint recognition electrode 114-1 is surrounded by only one mesh.

In the display substrate provided by the above-mentioned embodiments, a mesh-like shielding pattern 114-2 is provided around the fingerprint recognition electrode 114-1 in the same layer as the fingerprint recognition electrode 114-1, so that mutual interference between adjacent fingerprint recognition electrodes 114-1 is well shielded against, and the noise interference to the sensing capacitance formed between the fingerprint recognition electrode 114-1 and the finger is effectively reduced.

Figure 3:
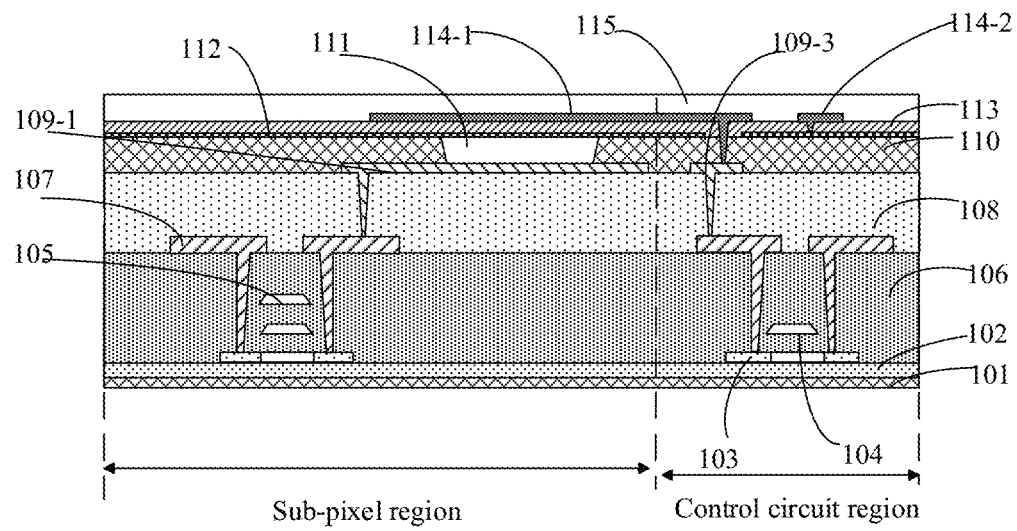
FIG. 3 is a third schematic cross-sectional view of a display substrate provided in an embodiment of the present disclosure.

As shown in FIG. 1 and FIG. 3, in some embodiments, the shielding pattern 114-2 is coupled to the cathode layer 112.

Illustratively, the shielding pattern 114-2 includes a mesh-like structure, the orthographic projection of the shielding pattern 114-2 onto the base substrate 101 and the orthographic projection of the cathode layer 112 onto the base substrate 101 have an overlapped region, and the shielding pattern 114-2 is electrically connected to the cathode layer 112 through a plurality of via holes.

By arranging the shielding pattern 114-2 to be coupled to the cathode layer 112, the shielding pattern 114-2 has a stable electric potential, so that the shielding pattern 114-2 has a better shielding effect; also, the shielding pattern 114-2 can function as an auxiliary cathode, which is advantageous in reducing the IR Drop of the cathode layer 112.

Figure 2:
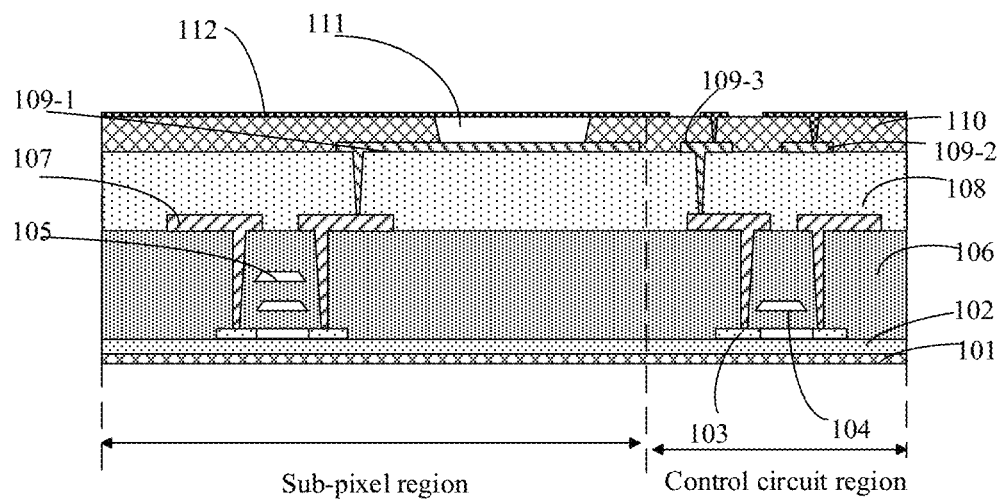
FIG. 2 is a second schematic cross-sectional view of a display substrate provided in an embodiment of the present disclosure.

As shown in FIG. 1 and FIG. 2, in some embodiments, the display substrate further includes: a first compensation pattern (such as 109-2 in FIG. 1 and FIG. 2), the first compensation pattern includes a mesh-like structure, the first compensation pattern is arranged in a same layer as the anode pattern 109-1 and is made of a same material as the anode pattern 109-1, and the first compensation pattern is coupled to the cathode layer 112.

Illustratively, the first compensation pattern has substantially the same shape as the shielding pattern 114-2, and the orthographic projection of the first compensation pattern onto the base substrate 101 substantially overlaps the orthographic projection of the shielding pattern 114-2 onto the base substrate 101.

Illustratively, the orthographic projection of the first compensation pattern onto the base substrate 101 and the orthographic projection of the cathode layer 112 onto the base substrate 101 have an overlapped region, and the first compensation pattern and the cathode layer 112 are electrically connected by a plurality of via holes.

Illustratively, the first compensation pattern, the shielding pattern 114-2, and the cathode layer 112 are electrically connected together to have a GND potential, or a VSS (i.e., the negative pole of a power supply) potential.

In the display substrate provided by the above embodiment, the first compensation pattern is coupled to the cathode layer 112, so that the first compensation pattern can function as an auxiliary cathode, which is advantageous in reducing the IR Drop of the cathode layer 112.

In addition, the first compensation pattern and the anode pattern 109-1 are arranged in the same layer and are made of the same material, so that the first compensation pattern and the anode pattern 109-1 can be formed simultaneously in the same patterning process, thereby further reducing the manufacturing flow and the manufacturing cost of the display substrate.

Figure 4:
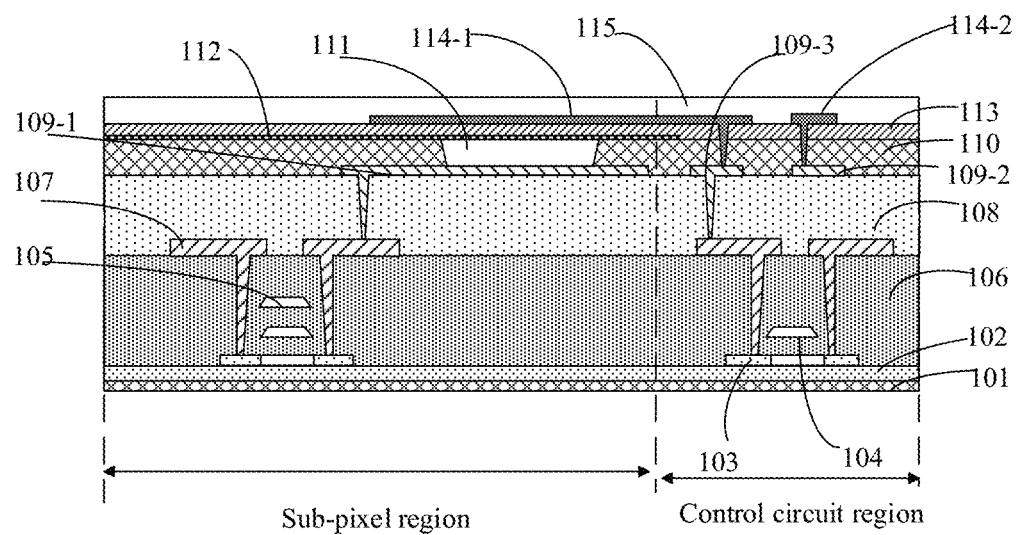
FIG. 4 is a fourth schematic cross-sectional view of a display substrate provided in an embodiment of the present disclosure.

As shown in FIG. 4, in some embodiments, the display substrate further includes:
  a second compensation pattern (such as 109-2 in FIG. 4), wherein the second compensation pattern includes a mesh-like structure, the second compensation pattern is arranged in the same layer as the anode pattern 109-1 and is made of the same material as the anode pattern 109-1, and the second compensation pattern is directly coupled to the shielding pattern 114-2.

Illustratively, the second compensation pattern is directly electrically connected to the shielding pattern 114-2, and the second compensation pattern is fed with a GND signal in an edge region of the display substrate, so that both the second compensation pattern and the shielding pattern 114-2 have a stable ground potential.

Illustratively, the second compensation pattern has substantially the same shape as the shielding pattern 114-2, and the orthographic projection of the second compensation pattern onto the base substrate 101 substantially overlaps the orthographic projection of the shielding pattern 114-2 onto the base substrate 101.

As shown in FIGS. 4, 6 and 7, illustratively, the orthographic projection of the second compensation pattern onto the base substrate 101 and the orthographic projection of the shield pattern 114-2 onto the base substrate 101 have an overlapped region, and the second compensation pattern and the shield pattern 114-2 are electrically connected through a plurality of via holes. Illustratively, a pixel definition layer 110 and a planar dielectric layer 113 are provided between the second compensation pattern and the shielding pattern 114-2, and after the planar dielectric layer 113 is fabricated, a plurality of via holes (such as Via2 in FIG. 7) penetrating the pixel definition layer 110 and the planar dielectric layer 113 are formed by using laser drilling, and the shielding pattern 114-2 and the second compensation pattern are directly electrically connected via the plurality of via holes.

The second compensation pattern and the anode pattern 109-1 are arranged in the same layer and are made of the same material, so that the second compensation pattern and the anode pattern 109-1 can be formed simultaneously in the same patterning process, thereby further reducing the manufacturing flow and the manufacturing cost of the display substrate.

The aforementioned directly coupling the second compensation pattern to the shielding pattern 114-2 simplifies the process flow of the display substrate. It is noted that, the directly coupling the second compensation pattern to the shield pattern 114-2 causes the second compensation pattern and the shield pattern 114-2 fail to function as an auxiliary cathode, therefore the structure is suitable for a display substrate having a small size and being insensitive to IR Drop of the cathode layer 112.

It is noted that both the first compensation pattern and the second compensation pattern can adopt the mesh structure as illustrated by reference numeral 109-2 in FIG. 6.

As shown in FIGS. 1 to 4, FIG. 6 and FIG. 7, in some embodiments, the fingerprint recognition structure further includes:
  a first electric-conductive connection portion 109-3 located between the control circuit and the fingerprint recognition electrode 114-1, the first electric-conductive connection portion 109-3 being coupled to the control circuit and the fingerprint recognition electrode 114-1 individually.

As shown in FIG. 4, illustratively, an organic planarization layer 108 is provided between the first electric-conductive connection portion 109-3 and the control circuit, and the first electric-conductive connection portion 109-3 is coupled to the control circuit via a via hole (such as Via1 in FIG. 6) penetrating the organic planarization layer 108; a pixel definition layer 110 and a planar dielectric layer 113 are provided between the first electric-conductive connection portion 109-3 and the fingerprint recognition electrode 114-1, and the first electric-conductive connection portion 109-3 is coupled to the fingerprint recognition electrode 114-1 through a via hole penetrating the pixel definition layer 110 and the planar dielectric layer 113.

Illustratively, after the fabrication of the planar dielectric layer 113 is completed, a plurality of via holes penetrating the pixel definition layer 110 and the planar dielectric layer 113 are formed by using laser drilling, and the fingerprint recognition electrode 114-1 and the first electric-conductive connection portion 109-3 are directly electrically connected through the plurality of via holes.

It should be noted that in the case that the via holes are formed using laser drilling, patterning of the film layer can be reduced.

The above-mentioned arranging the first electric-conductive connection portion 109-3 to be coupled to the control circuit and the fingerprint recognition electrode 114-1 individually not only avoids making a deep via hole, but also ensures the connection performance between the control circuit and the fingerprint recognition electrode 114-1.

As shown in FIG. 1 and FIG. 2, in some embodiments, the fingerprint recognition structure further includes:

a second electric-conductive connection portion between the first electric-conductive connection portion 109-3 and the fingerprint recognition electrode 114-1, the second electric-conductive connection portion being coupled to the first electric-conductive connection portion 109-3 and the fingerprint recognition electrode 114-1 individually.

Illustratively, a pixel definition layer 110 is provided between the second electric-conductive connection portion and the first electric-conductive connection portion 109-3, and the second electric-conductive connection portion is coupled to the first electric-conductive connection portion 109-3 via a via hole penetrating the pixel definition layer 110; a planar dielectric layer 113 is provided between the second electric-conductive connection portion and the fingerprint recognition electrode 114-1, and the second electric-conductive connection portion is coupled to the fingerprint recognition electrode 114-1 through a via hole penetrating the planar dielectric layer 113.

The above-mentioned arranging the second electric-conductive connection portions to be coupled to the first electric-conductive connection portion 109-3 and the fingerprint recognition electrode 114-1 individually not only avoids making a deep via hole, but also ensures the connection performance between the control circuit and the fingerprint recognition electrode 114-1.

In some embodiments, the first electric-conductive connection portion 109-3 and the anode pattern are disposed in the same layer and are made of the same material; and/or the second electric-conductive connection portion and the cathode layer 112 are disposed in the same layer and are made of the same material.

By arranging the first electric-conductive connection portion 109-3 and the anode pattern 109-1 in the same layer and making the first electric-conductive connection portion 109-3 and the anode pattern 109-1 out of the same material, the first electric-conductive connection portion 109-3 and the anode pattern 109-1 can be formed in the same patterning process, which is advantageous to simplifying the manufacturing process flow of the display substrate and reducing the manufacturing cost.

By arranging the second electric-conductive connection portion and the cathode layer 112 in the same layer and making the second electric-conductive connection portion and the cathode layer 112 out of the same material, the second electric-conductive connection portion and the cathode layer 112 can be formed in the same patterning process, which is advantageous to simplify the manufacturing process flow of the display substrate and reduce the manufacturing cost.

As shown in FIG. 5, in some embodiments, a plurality of control circuits included in the plurality of fingerprint recognition structures are arranged in array, the plurality of control circuits are divided into a plurality of rows of control circuits, and each row of control circuits includes multiple control circuits arranged along a first direction; the plurality of control circuits are divided into a plurality of columns of control circuits, and each column of control circuits includes multiple control circuits arranged along a second direction;

The display substrate also includes a plurality of recognition scanning lines L1 and a plurality of signal transmission lines L2.

At least part of each of the recognition scanning lines L1 extends along the first direction, the recognition scanning lines L1 are coupled to the control circuits in a corresponding row of control circuits, respectively; at least part of each of the signal transmission lines L2 extends along the second direction, and the signal transmission lines L2 are coupled to the control circuits in a corresponding column of control circuits, respectively; and the control circuit is used for outputting the sensing signal from the fingerprint recognition electrode 114-1 to the corresponding signal transmission line L2 under the control of the corresponding recognition scanning line L1.

Illustratively, the first direction includes a horizontal direction, and the second direction includes a vertical direction.

Illustratively, the plurality of control circuits are divided into a plurality of rows of control circuits arranged in a second direction, each row of control circuits including multiple control circuits arranged in the first direction; the plurality of control circuits are divided into a plurality of columns of control circuits arranged in the first direction, each column of control circuits including multiple control circuits arranged in the second direction.

Illustratively, the plurality of recognition scanning lines are arranged in the second direction, and the plurality of signal transmission lines are arranged in the first direction.

Illustratively, the plurality of recognition scanning lines are in one-to-one correspondence with the plurality of rows of control circuits, and the plurality of signal transmission lines are in one-to-one correspondence with the plurality of columns of control circuits.

Illustratively, the plurality of recognition scanning lines are coupled to the gate driving circuit GOA of the display substrate, and the plurality of signal transmission lines are coupled to the readout chip.

Illustratively, the plurality of recognition scanning lines are scanned one by one, to control the plurality of rows of control circuits to transmit, row by row, the sensing signals from the fingerprint recognition electrodes 114-1 to the corresponding signal transmission lines.

As shown in FIGS. 1 to 5, in some embodiments, the control circuit includes a control transistor KTFT, a gate electrode of the control transistor KTFT is coupled to a corresponding recognition scanning line L1, an input electrode of the control transistor KTFT is coupled to the fingerprint recognition electrode 114-1, and an output electrode of the control transistor KTFT is coupled to a corresponding signal transmission line L2.

The sub-pixel driving circuit includes a first transistor, and an output electrode of the first transistor is coupled to the anode pattern 109-1; the gate electrode of the control transistor is arranged in a same layer as the gate electrode of the first transistor and is made of a same material as the gate electrode of the first transistor; the active pattern of the control transistor is arranged in a same layer as an active pattern of the first transistor and is made of a same material as the active pattern of the first transistor; and both the input electrode of the control transistor and the output electrode of the control transistor are arranged in a same layer as the output electrode of the first transistor and are made of a same material as the output electrode of the first transistor.

Illustratively, the control transistor is an N-type transistor or a P-type transistor.

Illustratively, the sub-pixel driving circuit further includes a drive transistor, and the first transistor is connected between the drive transistor and a corresponding anode pattern 109-1.

Illustratively, the gate electrode of the control transistor and the gate electrode of the first transistor are both made by using a first gate metal layer; the active pattern of the control transistor and the active pattern of the first transistor are both made by using an active layer; the input electrode of the control transistor, the output electrode of the control transistor and the output electrode of the first transistor are all made by using a first source and drain metal layer.

By providing the gate electrode of the control transistor and the gate electrode of the first transistor arranged in the same layer and made of the same material, the active pattern of the control transistor and the active pattern of the first transistor arranged in the same layer and made of the same material, and the input electrode and the output electrode of the control transistor and the output electrode of the first transistor arranged in the same layer and made of the same material, the control circuit and the sub-pixel driving circuit can be synchronously manufactured, which not only simplifies the manufacturing process of the display substrate, but also reduces the manufacturing cost of the display substrate.

An embodiment of the present disclosure also provides a display apparatus including the display substrate provided by the above embodiments.

In the display substrate provided in the above-mentioned embodiments, the fingerprint recognition structure is integrated inside the display substrate, and the control circuit and the sub-pixel driving circuit are arranged in a direction parallel to the base substrate 101, so that the fingerprint recognition structure and the sub-pixel can be integrated in an embedded manner, not only enabling the display substrate to achieve full-screen fingerprint recognition at any display position and the maximum screen-to-body ratio, but also not significantly increasing the thickness and weight of the display substrate, which is beneficial to the development of lightweight and thin display substrates. Furthermore, the fingerprint recognition structure achieves fingerprint recognition by means of a touch-induced capacitance change, avoiding complicated optical path designs such as a collimating structure.

The display apparatus provided by the embodiments of the present disclosure also has the above-mentioned advantageous effects when including the above-mentioned display substrate, and will not be described in detail herein.

It is noted that the display apparatus may be: any product or component with a display function, such as a television, display, digital photo frame, mobile phone and tablet computer.

It should be noted that the various embodiments described herein are described in a progressive manner and the description of each embodiment focuses on its difference from other embodiments, thus the same or similar part among various embodiments may be referred with each other. In particular, the method embodiments are described more simply because they are substantially similar to the product embodiments, thus for the description of the related part, reference may be made to the product embodiments.

Unless defined otherwise, technical or scientific terms used in this disclosure shall have the ordinary meaning as understood by one of ordinary skill in the art to which this disclosure belongs. The use of "first", "second", and the like in this disclosure does not denote any order, quantity, or importance, but rather is used to distinguish one element from another. The word "including" or "includes", and the like, means that an element or item preceding the word covers the element or item listed after the word and equivalents thereof, but does not exclude other elements or items. The terms "connected", or "coupled" and the like, are not limited to physical or mechanical connections, but may include electrical connections, whether direct or indirect. The terms "upper", "lower", "left", "right" and the like are used only to indicate relative positional relationships that may change accordingly when the absolute position of the described object changes.

It will be understood that when an element such as a layer, film, region or base substrate is referred to as being "on" or "under" another element, it can be "directly on" or "directly under" the other element or intervening elements may be present.

In the description of the embodiments, particular features, structures, materials, or characteristics may be combined in a suitable manner in any one or more embodiments or examples.

While the foregoing is directed to specific implementations of the present disclosure, the scope of the present disclosure is not limited thereto. Any modifications or equivalent replacements easily occurring to those skilled in the art within the technical scope of the present disclosure shall fall within the scope of the present disclosure. Therefore, the scope of the present disclosure is defined by the claims.

What is claimed is:

1. A display substrate, comprising:
   a base substrate;
   a plurality of sub-pixels arranged on the base substrate, wherein the sub-pixels each comprise a sub-pixel driving circuit;
   a plurality of fingerprint recognition structures arranged on the base substrate, wherein the fingerprint recognition structures each comprise a control circuit and a fingerprint recognition electrode, the fingerprint recognition electrode is located on a side of the control circuit facing away from the base substrate, the control circuit is coupled to the fingerprint recognition electrode, and the control circuit is used for outputting a sensing signal from the fingerprint recognition electrode;
   wherein the control circuit and the sub-pixel driving circuit are arranged in a direction parallel to the base substrate;
   wherein the fingerprint recognition electrode includes an electric-conductive film layer having an antireflection function, and a thickness d of the fingerprint recognition electrode in a direction perpendicular to the base substrate satisfies:

$$2*d* \sin \theta = (2k+1)*\lambda/2;$$

wherein, $\lambda$ is wavelength of visible light, k is an integer greater than or equal to zero, and $\theta$ is an angle of incidence of ambient light into the fingerprint recognition electrode.

2. The display substrate according to claim 1, wherein the sub-pixels each comprise a pixel opening region; and an orthographic projection of the fingerprint recognition electrode onto the base substrate at least partially overlaps an orthographic projection of at least one pixel opening region onto the base substrate.

3. The display substrate according to claim 2, wherein the fingerprint recognition electrode comprises a transparent electric-conductive oxide film layer.

4. The display substrate according to claim 1, wherein the sub-pixels each further comprise an anode pattern, the anode pattern is located on a side of the sub-pixel driving circuit facing away from the base substrate, and the anode pattern is coupled to the sub-pixel driving circuit;
the display substrate further comprises:
a cathode layer, at least a portion of the cathode layer being located between the anode pattern and the fingerprint recognition electrode; and
a shielding pattern, at least a portion of the shielding pattern being located between adjacent fingerprint recognition electrodes in the plurality of fingerprint recognition structures.

5. The display substrate according to claim 4, wherein the shielding pattern comprises a mesh-like structure, and a mesh formed by the shielding pattern surrounds at least one fingerprint recognition electrode.

6. The display substrate according to claim 4, wherein the shielding pattern is coupled to the cathode layer.

7. The display substrate according to claim 6, further comprising:
a first compensation pattern, wherein the first compensation pattern comprises a mesh-like structure, the first compensation pattern is arranged in a same layer as the anode pattern and is made of a same material as the anode pattern, and the first compensation pattern is coupled to the cathode layer.

8. The display substrate according to claim 4, further comprising:
a second compensation pattern, wherein the second compensation pattern comprises a mesh-like structure, the second compensation pattern is arranged in a same layer as the anode pattern and is made of a same material as the anode pattern, and the second compensation pattern is directly coupled to the shielding pattern.

9. The display substrate according to claim 4, wherein the fingerprint recognition structures each further comprise:
a first electric-conductive connection portion between the control circuit and the fingerprint recognition electrode, the first electric-conductive connection portion being coupled to the control circuit and the fingerprint recognition electrode individually.

10. The display substrate according to claim 9, wherein the fingerprint recognition structures each further comprise:
a second electric-conductive connection portion between the first electric-conductive connection portion and the fingerprint recognition electrode, the second electric-conductive connection portion being coupled to the first electric-conductive connection portion and the fingerprint recognition electrode individually.

11. The display substrate according to claim 10, wherein the first electric-conductive connection portion is arranged in a same layer as the anode pattern and is made of a same material as the anode pattern;
and/or,
the second electric-conductive connection portion is arranged in a same layer as the cathode layer and is made of a same material as the cathode layer.

12. The display substrate according to claim 4, wherein the plurality of control circuits included in the plurality of fingerprint recognition structures are arranged in array,
the plurality of control circuits are divided into a plurality of rows of control circuits, and each row of control circuits comprises multiple control circuits arranged along a first direction;
the plurality of control circuits are divided into a plurality of columns of control circuits, and each column of control circuits comprises multiple control circuits arranged along a second direction;
wherein the display substrate further comprises a plurality of recognition scanning lines and a plurality of signal transmission lines; and
at least part of each of the recognition scanning lines extends along the first direction, the recognition scanning lines are coupled to the control circuits in a corresponding row of control circuits, respectively, at least part of each of the signal transmission lines extends along the second direction, and the signal transmission lines are coupled to the control circuits in a corresponding column of control circuits, respectively; and
the control circuit is used for outputting a sensing signal from the fingerprint recognition electrode to a corresponding signal transmission line under the control of a corresponding recognition scanning line.

13. The display substrate according to claim 12, wherein the control circuit comprises a control transistor, a gate electrode of the control transistor is coupled to a corresponding recognition scanning line, an input electrode of the control transistor is coupled to the fingerprint recognition electrode, and an output electrode of the control transistor is coupled to a corresponding signal transmission line;
the sub-pixel driving circuit comprises a first transistor, and an output electrode of the first transistor is coupled to the anode pattern; the gate electrode of the control transistor is arranged in a same layer as the gate electrode of the first transistor and is made of a same material as the gate electrode of the first transistor; an active pattern of the control transistor is arranged in a same layer as an active pattern of the first transistor and is made of a same material as the active pattern of the first transistor; and both the input electrode of the control transistor and the output electrode of the control transistor are arranged in a same layer as the output electrode of the first transistor and are made of a same material as the output electrode of the first transistor.

14. A display apparatus, comprising a display substrate, wherein the display substrate comprises:
a base substrate;
a plurality of sub-pixels arranged on the base substrate, wherein the sub-pixels each comprise a sub-pixel driving circuit;
a plurality of fingerprint recognition structures arranged on the base substrate, wherein the fingerprint recognition structures each comprise a control circuit and a fingerprint recognition electrode, the fingerprint recognition electrode is located on a side of the control circuit facing away from the base substrate, the control circuit is coupled to the fingerprint recognition electrode, and the control circuit is used for outputting a sensing signal from the fingerprint recognition electrode;
wherein the control circuit and the sub-pixel driving circuit are arranged in a direction parallel to the base substrate;

wherein the fingerprint recognition electrode includes an electric-conductive film layer having an antireflection function, and a thickness d of the fingerprint recognition electrode in a direction perpendicular to the base substrate satisfies:

$$2*d* \sin \theta=(2k+1)*\lambda/2;$$

wherein, $\lambda$ is wavelength of visible light, k is an integer greater than or equal to zero, and $\theta$ is an angle of incidence of ambient light into the fingerprint recognition electrode.

* * * * *